United States Patent
Yamaguchi et al.

(10) Patent No.: US 8,217,275 B2
(45) Date of Patent: Jul. 10, 2012

(54) SEALING MATERIAL AND MOUNTING METHOD USING THE SEALING MATERIAL

(75) Inventors: Atsushi Yamaguchi, Osaka (JP);
Hidenori Miyakawa, Osaka (JP);
Kousou Matsuno, Osaka (JP)

(73) Assignee: Panasonic Corporation, Osaka (JP)

( * ) Notice: Subject to any disclaimer, the term of this patent is extended or adjusted under 35 U.S.C. 154(b) by 481 days.

(21) Appl. No.: 12/517,311

(22) PCT Filed: Dec. 3, 2007

(86) PCT No.: PCT/JP2007/073331
§ 371 (c)(1),
(2), (4) Date: Jun. 2, 2009

(87) PCT Pub. No.: WO2008/069178
PCT Pub. Date: Jun. 12, 2008

(65) Prior Publication Data
US 2010/0084174 A1    Apr. 8, 2010

(30) Foreign Application Priority Data

Dec. 4, 2006 (JP) ............................ P 2006-326819
Dec. 8, 2006 (JP) ............................ P 2006-331733

(51) Int. Cl.
*H05K 1/00* (2006.01)
(52) U.S. Cl. ........................................ 174/258; 257/795
(58) Field of Classification Search .......... 257/788–789, 257/795; 174/255–258; 361/762, 792–795
See application file for complete search history.

(56) References Cited

U.S. PATENT DOCUMENTS

| 6,265,782 | B1 | 7/2001 | Yamamoto et al. |
| 6,274,389 | B1 | 8/2001 | Iida et al. |
| 6,303,219 | B1 | 10/2001 | Sawamura et al. |
| 6,322,848 | B1 | 11/2001 | Phenis et al. |
| 6,621,170 | B2 | 9/2003 | Yamamoto et al. |
| 6,664,318 | B1 | 12/2003 | Bymark et al. |
| 6,716,529 | B2 | 4/2004 | Sawamura et al. |
| 6,733,902 | B2 | 5/2004 | Sumita et al. |
| 6,800,373 | B2 | 10/2004 | Gorczyca |
| 7,070,670 | B2 | 7/2006 | Tomiyama et al. |
| 7,073,723 | B2 | 7/2006 | Furst et al. |

(Continued)

FOREIGN PATENT DOCUMENTS
JP     5-109838     4/1993
(Continued)

OTHER PUBLICATIONS

International Search Report issued Feb. 12, 2008 in International (PCT) Application No. PCT/JP2007/073331.

(Continued)

*Primary Examiner* — Jeremy Norris
(74) *Attorney, Agent, or Firm* — Wenderoth, Lind & Ponack, L.L.P.

(57) ABSTRACT

A sealing material is provided which has sealing characteristics with low stress and high reliability upon mounting electronic parts on a board, and good repairablity after the sealing. The sealing material contains a heat-curable resin component and is characterized by ΔE/ΔT in a range of from 0.5 MPa/° C. to 30 MPa/° C. wherein ΔE/ΔT represents a ratio of change (ΔE) in storage elastic modulus (E) relative to a temperature change (ΔT) when the storage elastic modulus (E) is determined as the temperature is raised within a temperature range including a glass transition point (Tg) of the cured sealing material.

9 Claims, 2 Drawing Sheets

U.S. PATENT DOCUMENTS

2005/0249891 A1 11/2005 Kitamura et al.
2008/0122088 A1 5/2008 Todd et al.

FOREIGN PATENT DOCUMENTS

| | | |
|---|---|---|
| JP | 6-5664 | 1/1994 |
| JP | 10-107095 | 4/1998 |
| JP | 10-178053 | 6/1998 |
| JP | 10-178054 | 6/1998 |
| JP | 10-209342 | 8/1998 |
| JP | 2000-154361 | 6/2000 |
| JP | 2000-178526 | 6/2000 |
| JP | 2001-151856 | 6/2001 |
| JP | 2002-343838 | 11/2002 |
| JP | 2003-128875 | 5/2003 |
| JP | 2003-518187 | 6/2003 |
| JP | 2003-246838 | 9/2003 |
| JP | 2004-27005 | 1/2004 |
| JP | 2004-59709 | 2/2004 |
| JP | 2006-176732 | 7/2006 |
| JP | 2007-511101 | 4/2007 |
| WO | 2005/048348 | 5/2005 |

OTHER PUBLICATIONS

Handbook of Plastics, Elastomers, and Composites, fourth edition. 2002. p. 5 1.3—Solid Properties of Polymers http://books.google.com/books?id=e8-FSos9PAkC
&q=glass+transition+temperature#v=onepage
&q=glass%20transition&f=false.

SEALING MATERIAL AND MOUNTING METHOD USING THE SEALING MATERIAL

This application is a U.S. national stage of International Application No. PCT/JP2007/073331 filed Dec. 3, 2007.

TECHNICAL FIELD

The present invention relates to a material for sealing an electrode connection of a circuit board on which electronic parts are mounted.

BACKGROUND ART

Recently, high-density packaging is required for the circuit board of an electronic device for the purpose of miniaturization, reduction in weight, sophistication and speeding up of the electronic device. For this reason, an electronic component and a semiconductor device (such as a chip component, a CSP (chip size package) IC) which are mounted on the circuit board is being miniaturized, reduced in thickness and speeded up and made so as to have multiterminals. As a result, a mechanical strength of the electronic component and/or the semiconductor device itself tends to be lowered, resulting in the increase in the number of the components and the devices which are weaker against mechanical stress and temperature change to which they are exposed. Further, the trend of the high-density packaging causes a more cost per electronic component and/or the semiconductor device and a more cost per circuit board on which the electronic parts are mounted.

A method for mounting an electronic component and/or a semiconductor device on a circuit board is commonly carried out, which includes:

positioning an electronic component and/or a semiconductor device at a predetermined position on a circuit board so that the corresponding electrodes are contacted, supplying a solder material or a conductive adhesive between the electrodes to be connected, connecting the electrodes of the electronic component and/or the semiconductor device to the electrodes of the circuit board in a reflow furnace, and sealing an area between the electronic component and/or the semiconductor device and the circuit board including connections with a resin, before or after, or in parallel with the connecting operation. This resin sealing is important for securing the electronic component and/or the semiconductor device to the circuit board even if the circuit board is exposed to heat cycle or an environment of high humidity and high temperature, and for protecting the connections between the electronic component and/or the semiconductor device and the circuit board with high reliability.

Patent Literature 1 (particularly in paragraph 0032) discloses an invention wherein a low elastic-modulus adhesive for electronic parts is used to reduce the thermal stress between the electronic parts and a wiring board. The purpose of the invention is to ensure the reliability of the circuit board on which the electronic parts are mounted when it is exposed to the heat cycle. This patent literature focuses on a point that the thermal stress occurs when the circuit board is exposed to the heat cycle because of difference between a thermal expansion coefficient of the semiconductor chip and that of the circuit board, and discloses that it is effective to use the low elastic-modulus adhesive for electronic parts in order to reduce the thermal stress.

In general, inspection or test (herein after, they are referred to collectively as "inspection") is conducted in a plurality of assembling stages in an assembling process of an electric appliance so as to detect faulty products (or off-specification products), and off-specification products that have been detected are excluded from the assembling process. Further, the product which is admitted as an on-spec product is sent to a subsequent assembling process so as to be used in the production of the electric appliance. In the case where the circuit board on which the electronic component and/or the semiconductor device is mounted (herein after, it is referred to as a "mounting-completed circuit board") is determined to be the off-specification product, discarding the mounting-completed circuit board as a whole leads to increase in the cost of the final product because the cost of each of the electronic component and/or the semiconductor device and the mounting-completed circuit board is high. Further, this discarding also leads to increase in the volume of industrial waste. For these reasons, such discarding is not desirable in that it imposes burdens on the producer, consumers and the environment.

The mounting-completed circuit boards determined to be off-specification products include electronic components and/or the semiconductor devices that are damaged by various causes including exposure to heat. In the case where many electronic components and/or many semiconductor devices are mounted on a single circuit board and one or a few of them are faulty (or do not comply with the specification) and the others are not damaged themselves, removing the electronic components and/or semiconductor devices which are determined as the faulty products (or off-specification products) and replacing them with normal ones make it possible to utilize the remaining parts of the mounting-completed circuit board as long as the faulty ones can be removed easily. Therefore, it is desirable, from the view points of cost reduction and the demands of the times such as resource saving and emission free (environmental protection), that only the faulty electronic components and/or faulty semiconductor devices are removed from the mounting-completed circuit board determined as off-specification products and the remaining electronic components and/or the semiconductor devices and the circuit board which retain necessary functions are recovered and/or the recovered ones are recycled. In should be noted that, with respect to the present invention, recovery and/or recycle of at least one of the circuit board, the electronic components and the semiconductor devices (these are also referred to as "board goods" hereinafter) is referred to as "repair" of the board goods.

For example, Patent Literatures 2 and 3 disclose that a resin having repairability is used for sealing so that the mounting-completed board can be recycled by repairing faulty electronic components and/or semiconductor devices when fault is found in one or several electronic components and/or semiconductor devices from a large number of components and/or devices mounted on the circuit board during the inspection which is made after mounting and sealing processes are completed. Further, Patent Literature 4 suggests a technique of removing the resin remaining on the circuit board by applying an adhesive having a higher strength to the resin followed by heating and detaching the resin with a plate for detachment. Furthermore, Patent Literature 5 suggests a technique of removing the resin remaining on the board with a grinding cutter.

LIST OF CITATION

Patent Literature 1: Japanese Unexamined Patent Literature 2000-154361
Patent Literature 2: Japanese Unexamined Patent Literature H10-107095

Patent Literature 3: Japanese Unexamined Patent Literature H10-209342
Patent Literature 4: Japanese Unexamined Patent Literature H05-109838
Patent Literature 5: Japanese Unexamined Patent Literature H06-5664

DISCLOSURE OF INVENTION

Problems to be Solved

In the invention disclosed in Patent Literature 1, the adhesive member of low elastic modulus for electronic component is used for reducing the thermal stress occurring between the electronic component and the wiring board. The inventors of the present invention has made various review for the purpose of preventing not only exfoliation or crack at the connections, but also exfoliation or crack in the electronic components and/or the semiconductor devices which are weaken, when external heat or external mechanical stress is applied. As a result, the inventors found that the exfoliation or the crack is effectively prevented from occurring in the connections and the electronic components and/or the semiconductor devices when a resin of high elastic modulus is used for sealing, since the thermal and/or the mechanical stress applied to the connections and the electronic components and/or the semiconductor devices after being sealed is lower, contrary to the invention disclosed in Patent Literature 1.

Further, according to the invention disclosed in Patent Literatures 2 and 3 which consider the repairability, the electronic parts are removed by heating the sealing material up to a temperature at which the solder material or the conductive adhesive is melted, followed by applying a shearing force during the repair. In this case, a large stress is required to be applied for removing the electronic parts since these sealing materials have high tackiness, resulting in a relatively high possibility of damaging the board to be recovered. Furthermore, these sealing materials with high tackiness make it difficult to be removed from the board completely, and therefore they cause inconvenience of removing the remaining sealing material in order that new electronic parts are mounted on the board.

According to the inventions disclosed in Patent Literatures 4 and 5, the possibility of damaging the boards to be recovered during the repair tends to be relatively high, since the relatively high mechanical stress is required to be applied to the electronic components and/or the semiconductor devices during the repair, similarly to those disclosed in Patent Literatures 2 and 3.

The present application is to solve the above problems in the prior art and one object of the present application is to provide an invention related to a sealing material which has characteristic that it can seal the connections of the electronic components and/or the semiconductor devices and the components and/or the devices themselves with low stress when mounting the components and/or the devices which are relatively weak. The sealing material preferably has good repairability enabling only the electronic components and/or the semiconductor devices which are determined to be faulty after the sealing step, to be repaired easily.

Another object of the present application is to provide an invention related to a method for mounting an electronic component and/or a semiconductor device using the sealing material which enables sealing with a low stress. The sealing material preferably has good repairability.

A further object of the present application is to provide an invention related to a mounted structure wherein an electronic component and/or a semiconductor device is mounted using the sealing material which enables sealing with a low stress. The sealing material preferably has good repairability.

Means for Solving the Problems

This application provides, in a first invention, a sealing material containing at least (a) a heat curable resin component and (b) a hardner, characterized by $\Delta E/\Delta T$ in a range of from 0.5 MPa/°C. to 30 MPa/°C. wherein $\Delta E/\Delta T$ represents a ratio of change ($\Delta E$) in storage elastic modulus (E) relative to a temperature change ($\Delta T$) when the storage elastic modulus (E) is determined as the temperature is raised within a temperature range including a glass transition point (Tg) of the cured sealing material.

In this invention, the heat curable resin component (a) may be selected from a group consisting of an epoxy resin composition, an urethane resin composition, a phenol resin composition and an acrylic resin composition. Of these compositions, the epoxy resin composition is preferable from the viewpoint of characteristics thereof such as hygroscopicity, thermal expansibility, and shrinkability upon curing.

Various epoxy resin compositions which are commonly employed can be used as the epoxy resin for this invention. Preferable epoxy resin compositions include a multifunctional epoxy resin with two or more functional groups, such as a bisphenol-type epoxy resin (a biphenol A-type epoxy resin, a bisphenol F-type epoxy resin, a bisphenol AD-type epoxy resin, a bisphenol AD-type epoxy resin), a novolak-type epoxy resin (a phenol novolak-type epoxy resin, a cresol novolak-type epoxy resin), a naphthalene-type epoxy resin, a biphenyl-type epoxy resin, and a cyclopentane-type epoxy resin. A mixture of two or more of these epoxy resins may be used. The epoxy resin may be selected considering a viscosity and properties thereof. It is most preferable that the bisphenol A-type epoxy resin is contained in an amount of from 10% to 100%, particularly from 50% to 100% in the multifunctional epoxy resin. One or more modified epoxy resins selected from a rubber-modified epoxy resin (a polyisoprene-modified epoxy resin, a polychloroprene-modified epoxy resin, a polybutadiene-modified epoxy resin) and a urethane-modified epoxy resin and a dimer-acid modified epoxy resin may be optionally added to the epoxy resin.

A monofunctional epoxy resin may be added as a (d) reactive diluent component (or a cross-linking density regulator) to the multifunctional epoxy resin so that the ratio of the monofunctional epoxy resin is about 0 wt % to about 30 wt %, preferably about 0 wt % to about 20 wt % (any of these ratios is a percentage by weight relative to the entire epoxy resin). The monofunctional epoxy resin is preferably a compound which has one epoxy group and an alkyl group having a carbon number of from 6 to 28 in a molecule. The carbon number in the alkyl group may be, for example, 8 or more, or 10 or more, or 12 or more. Further, the carbon number in the alkyl group may be, for example, 26 or less, 24 or less, and 22 or less. Accordingly, at least one resin selected from an alkyl glycidyl ether, a fatty acid glycidyl ester, and an alkyl phenol glycidyl ether each of which has the carbon number in the above range, may be used. The $C_6$-$C_{28}$ alkyl glycidyl ether is preferable. A mixture of two or more monofunctional epoxy resins may be used.

Also one or more compounds selected from a group consisting of a monoepoxide, a diepoxide, a triepoxide, a polyol, a polythiol, a polycarboxy and a urethane may be used as the reactive diluent component (d).

As the hardner component (b) for the present invention, a hardner suitable for curing the heat curable resin component (a) to be used is employed. In the case where the epoxy resin as described above is used as the heat curable resin component (a), it is preferable to use, as the hardner component (b), a compound selected from a group consisting of an amine compound, an imidazole compound, a modified amine compound, a modified imizazole compound, a polyphenol compound, and a sulfur-containing compound.

The amine compounds include, for example, an aliphatic polyamine such as dicyandiamide, diethylenetriamine, triethylenetetramine and diethylaminopropylamine, an atomatic polyamine such as m-xylenediamine and diaminodiphenylmethane, an alicyclic polyamine such as isophorone diamine and menthenediamine, and a polyamide.

The imidazole compounds include, for example, 2-methy imidazole, 2-ethyl-4-methyl imidazole and 2-phyenyl imidazole.

An epoxy compound adduct polyamine wherein an amine compound is added to an epoxy compound is exemplified as the modified amine compound. An imidazole adduct wherein an imidazole compound is added to the epoxy compound is exemplified as the modified imidazole compound.

Of these hardners, a potential hardner is preferable which is used for a one-component epoxy resin. The potential hardner is a hardner which does not advance curing of the epoxy resin for the time when a temperature around a normal temperature is applied even if it is mixed with the resin, and begins to advance the curing when heated to a temperature equal to or higher than a predetermined one. A modified amine compound-based hardner is particularly known as the potential hardner for the epoxy resin.

Considering the repairability, it is preferable to use both the modified amine in an amount of 5 wt % to 95 wt % relative to the total weight of the hardner, and a dicyandiamide in an amount of 95 wt % to 5 wt % relative to the total weight of the hardner. The compounding ratio of the harner is generally from 3 parts to 60 parts by weight relative to the epoxy resin 100 parts by weight, preferably from 5 parts by weight to 40 parts by weight.

Further, a preferable embodiment of the sealing material according to this invention is characterized in that it contains at least (a) the heat curable resin component and (b) the hardner therefor and a cured material obtained by curing the sealing material has the glass transition temperature (Tg) in a temperature range of from −80° C. to 50° C.

The sealing material of this invention may be of one-component type which contains all the components mixed before use or two-component type wherein the heat-curable resin component (a) and the hardner component (b) are separately stored before use and mixed upon use. The type of the sealing material can be determined based on the technical standard in the art, depending on the composition of the heat curable resin component (a) and the hardner component (b).

In the sealing material of this invention, one or more compounds may be used, as (c) an insulating filler component, which are selected from a group consisting of alumina, silica, alumina, boron nitride, aluminum nitride, silicon nitride, magnesia, magnesium silicate, talc, calcium carbonate and calcium hydroxide. The insulating filler component is added for the purpose of adjusting and/or optimizing the viscosity and the fluidity mainly. The insulating filler component is also added for the purpose of adjusting the thermal expansion coefficient, fluidity and adhesiveness. The sealing material of the present invention may further contain an additive, if desired. The additives include, for example, a hardening accelerator (for example, polyamine), a dye and a pigment.

The sealing material of this invention has a composition as described above and is characterized in that it shows a $\Delta E/\Delta T$ value in a range of from 0.5 MPa/° C. to 30 MPa/° C. wherein $\Delta E/\Delta T$ represents a ratio of change ($\Delta E$) in storage elastic modulus (E) relative to a temperature change ($\Delta T$) when the storage elastic modulus (E) is determined as the temperature is raised within a temperature range including a glass transition point (Tg) of the cured sealing material. This ratio of change in storage elastic modulus ($\Delta E/\Delta T$) (hereinafter referred to as a "storage elastic-modulus change rate") may be preferably 10 MPa/° C. or less, and particularly preferably 1 MPa/° C. or less. The preferable storage elastic-modulus change rate is occasionally 20 MPa/° C. or more, for example, 25 MPa/° C. or more. In the case where the storage elastic-modulus change rate is in this range, the plots of the storage elastic modulus (E) form a straight-like line with gentle inclination declining from the low temperature side to the high temperature side in a graph wherein an abscissa axis is temperature, a vertical axis is storage elastic modulus and the plots are values of the storage elastic modulus which are determined as the temperature rises. In this graph, it can be expressed that the storage elastic-modulus change rate is shown as the inclination of the straight line. For example, when the electronic parts are once fixed to the board with the sealing material and then they are required to be repaired, the sealing material which fixes the parts to be repaired is removed from the board by heating the material up to a predetermined temperature and contacting a tool (such as an iron) with the material around a border with the board. The sealing material can be removed or detached from the board without applying a large stress, that is, without applying an impact force or an excess force, by pressing the tool to the material with a minimum required force for a short time as long as the material shows the gentle inclination in the same way as the sealing material of the present invention. Accordingly, when the sealing material of the present invention is used, the sealing material can be separated from the board in a manner of so-called interface failure, without destroying the board, upon the repairing operation. The board and/or the electronic components and/or the semiconductor devices can be recovered being virtually undamaged, while the sealing material is given up. The recovered and virtually-undamaged board goods can be recycled (or reused) after being treated optionally. When the storage elastic-modulus change rate excesses 30 MPa/° C., the low-stress sealing characteristics cannot be exerted sufficiently. On the other hand, when the storage elastic-modulus change rate is below 0.5 MPa/° C., the sealing cannot show sufficient reliability as the elastic sealing material.

In FIG. 2, the graph is shown which shows the ratio of change in storage elastic modulus to temperature change ($\Delta E/\Delta T$). This graph shows a value of 0.8 MPa/° C. as $\Delta E/\Delta T$ in a temperature range including the glass transition point (Tg). This temperature range including the glass transition point (Tg) can be translated as a temperature range containing the glass transition point (Tg) between limits. This range, however, means a range which covers a range of from a temperature lower than the glass transition point (Tg) and a temperature higher than the glass transition point (Tg).

The cured sealing material of this present invention preferably has the glass transition point (Tg) of −80° C. or higher, and it may preferably have the glass transition point (Tg) of, for example, −70° C. or higher, −60° C. or higher, −50° C. or higher, −40° C. or higher, −30° C. or higher, −20° C. or higher, or −10° C. or higher. Further, the cured sealing material of this present invention preferably has the glass transition point (Tg) of 100° C. or less, and it may preferably have the glass transition point (Tg) of, for example, 90° C. or less, 80° C. or less, 70° C. or less, 60° C. or less, 50° C. or less, 40° C. or less, 30° C. or less, 20° C. or less, 10° C. or less, or 0° C. or less.

In the case where the sealing material having such characteristics is used, the sealing material covering at least the connections between the circuit board and the electronic components and/or the semiconductor devices suitably can seal the connections because the sealing material retains a relatively high adhesive strength (for example, 0.5 kg/mm$^2$) at the practical working temperature. On the other hand, the sealing material is soften sufficiently by being heated up to, for example, about 220° C. and thus the sealing material bonded to the electronic components and/or the semiconductor devices to be repaired can be removed with relative ease from the circuit board. Accordingly, this sealing material can show suitable repairability after sealing.

The sealing material of this invention can be characterized in that it has an elastic modulus of 100 MPa or higher, preferably 500 MPa or higher, and more preferably 800 MPa or higher, and further preferably 1 GPa or higher at a temperature(s) T1 which is lower than the glass transition point (Tg). Further, the sealing material of this invention can be characterized in that it has the elastic modulus of 200 MPa or lower, preferably 50 MPa or lower, more preferably 10 MPa or lower at a temperature(s) T2 which is higher than the glass transition point (Tg). The sealing material of the present invention which shows such elastic modulus over the temperature ranges lower and higher the glass transition point (Tg) can reveal suitable sealing characteristics. Further, the sealing material of the present invention can reveal suitable repairability. The sealing material having the elastic modulus below 100 MPa at the temperature T1 lower than the glass transition point (Tg), and the elastic modulus over 10 MPa at the temperature T2 higher than the glass transition point (Tg) presents insufficient strength, resulting in insufficient reliability as to the sealing characteristics.

For example, the sealing material has the storage elastic-modulus change rate ($\Delta E/\Delta T$) over the preferable value defined in the present invention, if the elastic modulus of this material is changed from a value of 100 MPa or higher at the temperature T1 to a value of 10 MPa or lower at the temperature T2 during the determination of the storage elastic-modulus change rate ($\Delta E/\Delta T$) to the temperature change which ranges from a lower limit temperature (for example, the temperature T1) over 50° C. to an upper limit temperature (for example, the temperature T2) below 200° C. When the sealing material having such characteristics is used, the elastic-modulus change thereof is too drastic around the glass transition point (Tg), whereby the sealing with low stress cannot be achieved and the possibility of damaging the components is increased.

Further, in the case where the material presents a glass transition point (Tg) of 100° C. or lower after it has been cured, it shows good repairability at a detachment temperature of a bonding material. For example, when a conductive adhesive or a lead-free solder material of Sn-3Ag-0.5Cu system is used, the sealing material is sufficiently soften to be removed easily at around 220° C. which is an melting point of the solder material.

As described above, the sealing with low stress can be achieved in the connections, as well as to the electronic components and/or the semiconductor devices themselves, upon mounting the weak electronic components and/or the semiconductor devices. Further, the sealing material is sufficiently softened and easy to exfoliate, and then removed involving the removal of the electronic components and/or the semiconductor devices, when the bonding material is heated to a temperature where it is detached, generally a melting point of the bonding material.

This application provides, in a second invention, a method for mounting an electronic element (or an electronic part) on a circuit board which comprises sealing a connection between an electrode of the circuit board and the electrode of an electronic component and/or a semiconductor device that is to be fixed corresponding to the electrode of the board, and space between the circuit board and the electronic component and/or the semiconductor device with the sealing material according to the first invention of the present application. The mounting method specifically includes:

(i) placing the electronic part at a predetermined position on the circuit board to form a conductive connection, (ii) supplying the conductive connection and the space around the connection with any of sealing materials of present invention as described above, and (iii) heating the board.

This application can also provide a method for mounting an electronic element (or an electronic part) on a circuit board characterized by comprising:

(i) placing the electronic element at a predetermined position on the circuit board to form a conductive connection, (ii) supplying the conductive connection and a space around the connection with a sealing material which has, after the material has been cured, a glass transition point (Tg) of from −80° C. to 50° C., and (iii) heating the board.

The present application provides, in a third invention, a mounted structure wherein electronic part is mounted on a circuit board, the electronic part is placed at a predetermined position, a conductive connection is formed between an electrode of the circuit board and a corresponding electrode of the electronic part, and an area around the conductive connection and an area between the electronic part and the circuit board are sealed with the sealing material of the first invention.

Effect of Invention

The sealing material according to the first invention of the present invention presents such characteristics as, when it is used for mounting the electronic components and/or the semiconductor devices which are relatively weak on the circuit board, it can seal the connections, as well as the electronic components and/or the semiconductor devices themselves with relatively low stress, while it can provide good repairability after the sealing. Further, it can present good initial sealing property and good durable sealing property. In other words, the sealing material can seal the connections of the electronic components and/or the semiconductor devices mounted on the circuit board and the electronic components and/or the semiconductor devices for a relatively long period of time with a low stress. Accordingly, it is possible to reduce considerably the damage of the components and so on during the sealing process, and the damage of the component and so on caused by the exposure to the temperature cycle, resulting in the substantial prevention of damage. Further, the cured sealing material which seals the connections and the electronic components and/or the semiconductor devices retains good repairability which enables the material to be removed with relative ease by being heated to the temperature equal to or higher than the glass transition point (Tg).

The method for mounting the electronic components and/or the semiconductor devices with the sealing material of the first invention, according to the second invention of this application, can seal the connections and the electronic components and/or the semiconductor devices with relatively low stress. Accordingly, the electronic components and/or the semiconductor devices can be mounted substantially preventing the occurrence of damage of the electronic parts during the sealing process or the damage due to the exposure to the temperature cycle. Further, the repairing can be suitably conducted after the sealing.

The mounted structure where the electronic components and/or the semiconductor devices are sealed with the sealing material of the first invention, according to the third invention of the present application, enables the damage to be substantially prevented from occurring in the manufacturing stage or in use since the connections and the electronic components and/or the semiconductor devices are sealed with relative low stress. The sealing with relatively low stress can present good initial sealing property and durable sealing property. Accordingly, the occurrence of damage of the parts in the sealing process and the damage of the parts due to the exposure to the temperature cycle are substantially prevented and thereby the mounted structure wherein the electronic components and/or the semiconductor devices are mounted. Further, the repairing can be suitably conducted after the sealing.

Accordingly, the sealing material of the present invention can exert apparent contradict effect such that it can retain the persistent sealing with low stress after the sealing with respect to the on-spec product, while it can permit the repair with relative ease with respect to the off-specification product, when the sealing material is used in an assembly process of an electric product wherein inspections are made in various assembly stages and the on-spec product is sent to a further assembly process to produce the electric product and the off-specification product is subjected to the repairing.

DESCRIPTION OF NUMERALS

1 Semiconductor chip
2 Solder material or conductive adhesive ball
3 Solder material or conductive adhesive
4 Sealing material
5 Land
6 Board Embodiments FOR CARRYING OUT THE INVENTION The present invention is described with reference to FIG. 1 which shows a preferable embodiment of the present invention.

<Sealing and Mounting Operation>

Figure 1:
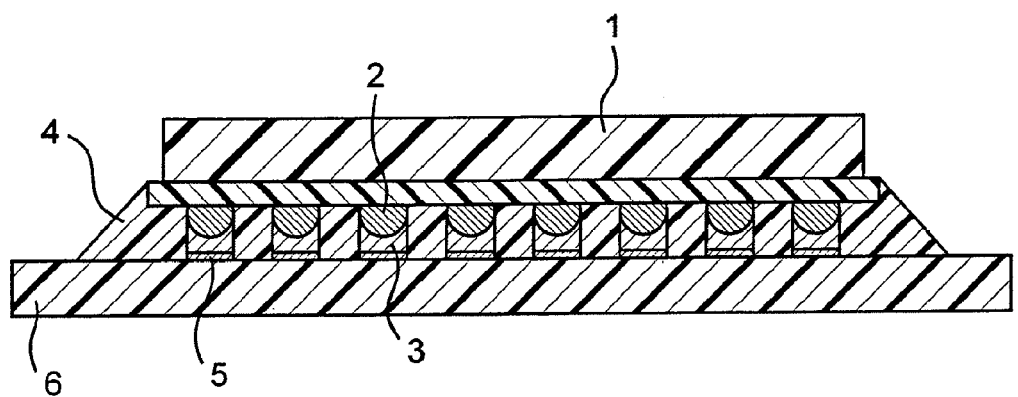
FIG. 1 is a schematic view showing a state wherein semiconductor chip is mounted on a circuit board.

FIG. 1 schematically shows a semiconductor device 1 and a glass-epoxy circuit board 6 where the device 1 is to be fixed. The semiconductor device 1 is provided with solder balls (electrodes) 2 and lands (electrodes) 5 are provided on the circuit board 6, which correspond to the electrodes 2 respectively. The solder balls (electrodes) 2 on the side of the semiconductor device 1 are bonded to the lands (electrodes) 5 on the side of the circuit board 6 with the solder 3, and thereby the electric connection is established. The sealing material 4 is applied to the connections by the solder 3 and to the area between the circuit board 6 and the semiconductor device 1 around the connections, so as to seal the connections and the area between the circuit board 6 and the semiconductor device 1 around the connections.

Specific mounting operation was conducted as follows. Cream solder (M705-221BM5-K, Senju Metal Industry Co., Ltd.) was applied to the electrodes of a glass epoxy substrate having a thickness of 1.6 mm wherein a wiring is provided, and a CSP wherein a carrier substrate was of alumina, having a chip size of 13 mm×13 mm, an electrode diameter of 0.5 mm and an electrode pitch of 0.8 mm, was bonded by reflow soldering.

Then, a heat-curable resin composition was applied to the area around the connections between the CSP and the circuit board, using a dispenser, and the resin was heated at 80° C. for 30 minutes and then heated up to 150° C. for 60 minutes so that the resin was cured sufficiently. In this process, the heated heat-curable resin had sufficiently fluidity before it was cured, and thus was able to penetrate into space between the CSP and the circuit board to fill the space sufficiently. When the heat-curable resin was further heated, the resin became to be cured with insulating filler somewhat deposited, and thus sealed the area between the CSP and the circuit board to give a desired CSP-mounted structure. Tg of the cured material was 40° C.

(1) Initial sealing property: Evaluation of the initial sealing material was carried out as follows. The CSP-mounted structure wherein the sealing of the connections had been completed by curing the heat-curable resin composition was inspected by observing the connections visually and/or microscopically as to whether defect (such as cracking on the surface of the CSP, or the like) was found or not. The inspection was made for ten test samples. The example wherein no defect was found was evaluated as "○" (acceptable) and the example wherein defect was found was evaluated as "X" (rejected).

(2) Durable sealing property: The evaluation of the durable sealing property (so-called heat cycle test) was carried out as follows. The CSP-mounted structure of which initial sealing property was evaluated as "○" was subjected to a temperature cycle test of which one cycle includes −40° C.×30 minutes to +85° C.×30 minutes, using a heat cycle tester (conforming to JISC60068, manufactured by ETAC). The conduction test for the test sample was carried out when the number of the cycles reached predetermined ones so that the electrical connection between the CSP and the board was confirmed. When the conduction was established when the number of cycles was 1000 or more, the test sample was evaluated as "○" (acceptable). When the conduction became unestablished before the number of cycles reached 1000 because of disconnection, the test sample was evaluated as "X" (rejected). Any of the semiconductor element-mounted structures described below in Example was evaluated as acceptable over 1000 cycles.

(3) The glass transition point (Tg) and the storage elastic modulus E' of the cured sealing material were determined using a dynamic viscoelastic measurement device (DVA-200 manufactured by I T KEISOKU SEIGYO KK), under the conditions as follows:

test sample size: 20 mm in a longitudinal direction, 5 mm in a transverse direction, and 1 mm in a height;

temperature rising speed: 10° C./min; and tension mode, 10 Hz, and automatic static load. The peak top temperature of loss elastic modulus E" was determined as the glass transition point (Tg).

The characteristics of the sealing material of each of Examples 1-10 and Comparative Examples 1 and 2 are shown in Table 1, which example was tested focusing on the storage elastic modulus E' and the storage modulus change rate (ΔE/ΔT) in the case where the temperature T1 was 50° C. and the temperature T2 was 200° C.

scratching operation of the sealing material with the spatula and the removal operation of the solder material with the braided wire for sucking solder were able to be conducted as a continuous operation within 5 minutes. Accordingly this repairing operation was sufficiently practical.

TABLE 1

|  |  | Example 1 | Example 2 | Example 3 | Example 4 | Example 5 | Example 6 | Example 7 |
|---|---|---|---|---|---|---|---|---|
| Component (a) |  | Bisphenol A-type epoxy base | Bisphenol A-type epoxy base | Bisphenol A-type epoxy base | Bisphenol A-type epoxy base | Bisphenol F-type epoxy base | Bisphenol A-type epoxy base | Urethane base |
| Temperature T1 | Temperature (° C.) | 50 | 50 | 50 | 50 | 50 | 50 | 50 |
|  | Elastic Modulus E (MPa) | 120 | 110 | 150 | 2000 | 6000 | 130 | 100 |
| Temperature T2 | Temperature (° C.) | 200 | 200 | 200 | 200 | 200 | 200 | 200 |
|  | Elastic Modulus E (MPa) | 1 | 0.5 | 9 | 5 | 8 | 5 | 1 |
| Glass Transition Point (Tg) |  | −48 | −4.5 | 2.8 | 40 | −30 | 50 | −70 |
| ΔE/ΔT |  | 0.8 | 0.7 | 0.9 | 1.3 | 30 | 0.5 | 0.7 |
| Initial Sealing Property |  | ○ | ○ | ○ | ○ | ○ | ○ | ○ |
| Durable Sealing Property |  | ○ | ○ | ○ | ○ | ○ | ○ | ○ |

|  |  | Example 8 | Example 9 | Example 10 | Comparative Example 1 | Comparative Example 2 |
|---|---|---|---|---|---|---|
| Component (a) |  | Bisphenol F-type epoxy base | Urethane base | Bisphenol F-type epoxy base | Bisphenol A-type epoxy base | Bisphenol A-type epoxy base |
| Temperature T1 | Temperature (° C.) | 50 | 50 | 50 | 50 | 50 |
|  | Elastic Modulus E (MPa) | 1000 | 1500 | 130 | 5000 | 6000 |
| Temperature T2 | Temperature (° C.) | 200 | 200 | 200 | 200 | 200 |
|  | Elastic Modulus E (MPa) | 2 | 6 | 1 | 5 | 10 |
| Glass Transition Point (Tg) |  | 0 | −50 | −40 | 150 | 160 |
| ΔE/ΔT |  | 6.7 | 6.7 | 0.9 | 33 | 40 |
| Initial Sealing Property |  | ○ | ○ | ○ | X | X |
| Durable Sealing Property |  | ○ | ○ | ○ | X | X |

<Repairing Operation>

The repairability of the mounted structure wherein the CSP was mounted with the sealing material of the present invention was evaluated. Ten (10) CSP-mounted structures were randomly selected from one hundred CSP-mounted structures which were obtained by the above-described mounting operation. A heatable suction tool is pressed to an upper surface of the CSP and heated to 250° C. for one minute. Then, a metal separation lever (a tool for separation) was inserted between the CSP and the circuit board to lift the CSP. Since the sealing material was sufficiently softened, the CSP was easily separated destroying the sealing material easily.

The glass-epoxy circuit board from which the CSP had been removed was placed on a hot plate. With the glass epoxy board kept at 100° C., a solvent (for example, PS-1 (trade name) manufactured by DAI-ICHI KOGYO SEIYAKU CO., LTD., 7360 by LOCTITE (trade name), or the like) is used to swell the sealing material remained on the board, and the swelled material was scratched by a plastic spatula. Further, the solder material remained on the glass epoxy circuit board was removed using a braided wire for sucking solder.

The repairing operation was repeated ten times for the mounted structure in each example. In each example, the The operation of keeping the temperature of the board at about 100° C. on the hot plate may be replaced with an operation of heating the board with a far-infrared heater.

Cream solder was applied again to the glass-epoxy circuit board from which the CSP was removed in the manner as described above, and a new CSP was mounted on the board. The cream solder may be printed on the new CSP.

The CSP-mounted structure was obtained by carrying out the heating treatment after the heat-curable resin composition was applied to the area around the connections of the CSP and then curing the heat-curable resin in the same manner as that in the above-described mounting operation. Electrical connection was surely made also in the mounted structure wherein the CSP was mounted after the repair, and this structure presented excellent property in the heat-shock test, similarly to the not-repaired one.

EXAMPLE 1

A sealing material was prepared by mixing:
(a) bisphenol A-type epoxy resin of 100 parts by weight, as the heat-curable resin component,
(b) dicyandiamide of 8 parts by weight, as the hardner component corresponding to the resin component, (c) alumina filler 0 having a 50% mean particle size of 5 μm of 10 parts by weight as the insulating filler, and (d) alkyl glycidyl ether of 10 parts by weight as the reactive diluent (the adjuster for cross-linking) component, and further adding a hardening accelerator of 1 parts by weight which is suitable for a combination of the heat-curable resin component and the hardner component. The viscosity of the mixture just after the mixing was 28000 mPa·s.

Figure 2:
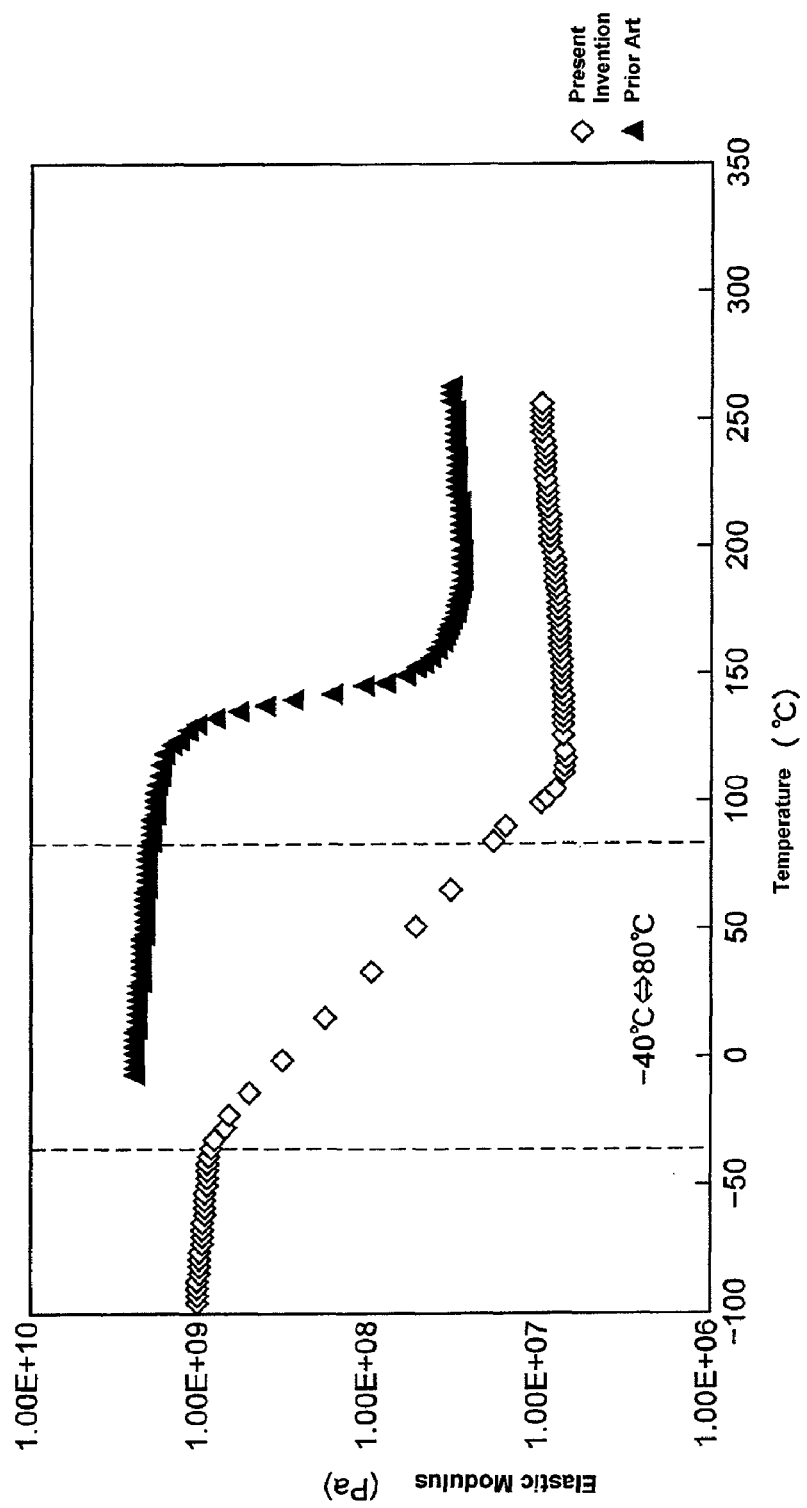
FIG. 2 is a graph wherein an abscissa axis is temperature, a vertical axis is storage elastic modulus E, and the change ($\Delta E$) of the storage elastic modulus relative to the temperature change ($\Delta T$) is plotted.

The resultant sealing material was cured by being subjected to the sealing conditions as described above and the glass transition point (Tg) and the storage elastic modulus E of the cured sealing material were determined. The glass transition point (Tg) was −48° C. The storage elastic modulus E was also determined while the temperature was raised from the temperature T1 (50° C.) to the temperature T2 (200° C.). The storage elastic modulus E was plotted on the condition that the abscissa axis is temperature and the vertical axis is the storage elastic modulus E with logarithmic scale. As a result, a graph curved as "S" shape was obtained as shown in FIG. 2. In other words, although the storage elastic modulus E did not show substantial change in a temperature area of not higher than the temperature T1 (50° C.) and the temperature area of not lower than the temperature T2 (200° C.), it showed relatively large change in the temperature area of from the temperature T1 (50° C.) to the temperature T2 (200° C.) which area contained the glass transition point (Tg), as shown in FIG. 2. The storage elastic-modulus change rate relative to the temperature change (ΔE/ΔT) was 0.8, which rate corresponds to inclination of the tangential line around the inflection point of this graph.

EXAMPLES 2-10

In Examples 2-4 and 6, a combination of (a) a bisphenol A-type epoxy resin as the heat-curable resin component, and (b) a combination of dicyandiamide and a modified amine as the hardner component was used. (c) The insulating filler component and (d) the reactive diluent (the adjuster for cross-linking) component (d) were the same as those used in Example 1.

In Examples 5, 8 and 10, a combination of (a) a bisphenol F-type epoxy resin as the heat-curable resin component, and (b) a combination of dicyandiamide and a modified amine as the hardner component was used. (c) The insulating filler component and (d) the reactive diluent (the adjuster for cross-linking) component were the same as those used in Example 1.

In Examples 7 and 9, an urethane-based resin composition was used as the heat-curable resin component (a) and the hardner component (b). (c) The insulating filler component was the same as that employed in Example 1.

The glass transition point (Tg) and the storage elastic modulus E were determined in the same manner as that in Example 1, after the sealing material of each example had been cured. The results are shown in Table 1. In any of examples, the storage elastic-modulus change rate relative to the temperature change (ΔE/ΔT) was in a range of from 0.5 MPa/° C. to 30 MPa/° C.

COMPARATIVE EXAMPLE

As shown in Table 1, the sealing material of Comparative Example 1 had the glass transition point (Tg) of 150/° C. after it was cured, the storage elastic-modulus change rate relative to the temperature change (ΔE/ΔT) determined around the glass transition point (Tg) was 33 MPa/° C.

This sealing material was used in the sealing and mounting operations. As a result, the cracks were found in the CSP with respect to five or more of ten test samples. Accordingly, the initial sealing property for practical use could not be obtained. It is considered that this is because the shrinking stress of the sealing material upon being cured is large.

As shown in Table 1, the sealing material of Comparative Example 2 had the glass transition point (Tg) of 160° C. after it was cured, and the storage elastic-modulus change rate relative to the temperature change (ΔE/ΔT) determined around the glass transition point (Tg) was 40 MPa/° C.

This sealing material was used in the sealing and mounting operations. As a result, the cracks were found in the CSP with respect to six or more of ten test samples. Accordingly, the initial sealing property for practical use could not be obtained. It is considered that this is because the storage elastic-modulus change rate relative to the temperature change (ΔE/ΔT) around Tg is too large.

EXAMPLES 11-21

Another test was conducted focusing on the elastic modulus at each temperature of −40° C., 25° C. and 80° C. The characteristics of the sealing material of each of Examples 11-21 and Comparative Examples 3-4 are shown in Table 2

TABLE 2

|  |  | Example 11 | Example 12 | Example 13 | Example 14 | Example 15 | Example 16 | Example 17 |
|---|---|---|---|---|---|---|---|---|
| Component (a) (parts by weight) | | Bisphenol A-type epoxy resin (30) | Bisphenol A-type epoxy resin (30) | Bisphenol A-type epoxy resin (30) | Bisphenol A-type epoxy resin (30) | Bisphenol A-type epoxy resin (30) | Bisphenol A-type epoxy resin (30) | Bisphenol A-type epoxy resin (30) |
| Component (b) (parts by weight) | | Thiol (40) | Acid anhydride (27.5) | Acid anhydride (27.5) | Acid anhydride (27.5) | Phenol (30) | Thiol (30) | Acid anydride (27.5) |
| Component (c) (parts by weight) | | Silica (5) | Silica (37.5) | Silica (37.5) | Silica (37.5) | — | Silica (30) | Silica (37.5) |
| Elastic Modulus (Pa) | −40° C. | 3.1G | 2.7G | 4.7G | 2G | 5.2G | 7.6G | 4.1G |
| | 25° C. | 1.9G | 600M | 130M | 3M | 22M | 370M | 6.1M |
| | 80° C. | 120M | 21M | 19M | 1M | 13M | 45M | 6.3M |
| Glass Transition Point (Tg) | | 42° C. | 39° C. | 15° C. | 2.8° C. | 0.7° C. | −2.1° C. | −2.3° C. |
| Initial Sealing Property | | Δ | ◯ | ◯ | ◯ | ◯ | ◯ | ◯ |
| Durable Sealing Property | | X | X | X | ◯ | ◯ | ◯ | ◯ |

TABLE 2-continued

|  | Example 18 | Example 19 | Example 20 | Example 21 | Comparative Example 3 | Comparative Example 4 |
|---|---|---|---|---|---|---|
| Component (a) (parts by weight) | Bisphenol A-type epoxy resin (30) | Bisphenol A-type epoxy resin (30) | Bisphenol A-type epoxy resin (30) | Bisphenol A-type epoxy resin (30) | Bisphenol A-type epoxy resin (20) | Bisphenol A-type epoxy resin (20) |
| Component (b) (parts by weight) | Thiol (40) | Amine (30) | Amine (30) | Amine (30) | Acid anhydride (50) | Acid anhydride (50) |
| Component (c) (parts by weight) | Silica (30) | — | — | — | — | — |
| Elastic Modulus (Pa) −40° C. | 1.3G | 1.3G | 100M | 260M | 3.4G | 3.7G |
| 25° C. | 4.7M | 4.7M | 2.7M | 49M | 2.3G | 2.8G |
| 80° C. | 1.4M | 1.4M | 1.1M | 4.4M | 2.4G | 1.9G |
| Glass Transition Point (Tg) | −33° C. | −48.4° C. | −68.2° C. | −80° C. | 164° C. | 90° C. |
| Initial Sealing Property | ○ | ○ | ○ | ○ | X | X |
| Durable Sealing Property | ○ | ○ | ○ | ○ | X | X |

EXAMPLE 11

A sealing material was prepared by mixing:
(a) bisphenol A-type epoxy resin of 100 parts by weight, as the heat-curable resin component,
(b) dicyandiamide of 8 parts by weight, as the hardner component corresponding to the resin component,
(c) alumina filler 0 having a 50% mean particle size of 5 μm of 10 parts by weight as the insulating filler, and
(d) alkyl glycidyl ether of 10 parts by weight as the reactive diluent (the adjuster for cross-linking) component, and further adding a hardening accelerator of 1 parts by weight which is suitable for a combination of the heat-curable resin component and the hardner component. The viscosity of the mixture just after the mixing was 28000 mPa·s.

The resultant sealing material was cured by being subjected to the sealing conditions as described above and the glass transition point (Tg) and the storage elastic modulus E of the cured sealing material were determined. The glass transition point (Tg) was 2.8° C.

The storage elastic modulus was also determined while the temperature was raised from the temperature T1 (50° C.) to the temperature T2 (200° C.). The storage elastic modulus E was plotted on the condition that the abscissa axis is temperature and the vertical axis is the storage elastic modulus E with logarithmic scale. As a result, a graph curved as "S" shape was obtained as shown in FIG. 2. In other words, although the storage elastic modulus did not show substantial change in a temperature area of not higher than the temperature T1 (50° C.) and the temperature area of not lower than the temperature T2 (200° C.), it showed relatively large change in the temperature area of from the temperature T1 (50° C.) to the temperature T2 (200° C.) which area contains the glass transition point (Tg), as shown in FIG. 2.

EXAMPLES 12-21

In Examples 12-21, (a) a bisphenol A-type epoxy resin as the heat-curable resin component was used. (b) The corresponding hardner component used in each examples were as follow: thiol in Examples 16 and 18, amine in Examples 12, 13, 19-21, an acid anhydride in Examples 14 and 17, phenol in Example 15. (c) The insulating filler component and (d) the reactive diluent (the adjuster for cross-linking) component were the same as those used in Example 11.

After the sealing material of each example was cured, the glass transition point (Tg) and the storage elastic modulus E were determined in the same manner as in Example 11. The results are shown in Table 2. In any of examples, the cured material had the glass transition point (Tg) in a temperature range of from −80° C. to 50° C.

COMPARATIVE EXAMPLE

In Comparative Examples 3 and 4, (a) bisphenol A-type epoxy resin as the heat-curable resin component and (b) an acid anhydride as the corresponding hardner component were used. (c) The insulating filler component and (d) the reactive diluent (the adjuster for cross-linking) were the same as those employed in Example 1. The glass transition points (Tg) of the cured materials were 164° C. in Comparative Example 3, and 90° C. in Comparative Example 4.

This sealing material was used in the sealing and mounting operations. As a result, the cracks were found in the CSP with respect to five or more of one hundred test samples. Accordingly, the initial sealing property for practical use could not be obtained. It is considered that this is because the shrinking stress of the sealing material upon being cured is large.

The curing process and the following cooling process of the sealing materials obtained in Examples 11-21 and Comparative Examples 3-4 for manufacturing the mounted structure, were observed using a reflow simulator (manufactured by CORES CORPORATION). In each process, default was not found in the sealing materials of Examples 11-21. With respect to the sealing materials of Comparative Examples 3 and 4, it was found that the crack occurred on the CSP at about 30° C. which is lower than the glass transition point (Tg) in the cooling process wherein the temperature was lowered to a room temperature (25° C.) after the temperature was raised to 150° C. (the curing process).

It is considered that this is caused by the fact that all the sealing materials in Examples 11-21 have the glass transition points (Tg) within the range of from −80° C. to 50° C. and therefore they can retain so-called rubber state over the substantial entire of the temperatures to which the sealing materials were exposed during the temperature change, while the sealing materials of Comparative Examples 3 and 4 have the glass transition points (Tg) of 50° C. or higher and therefore those materials exist in glass state through the lower temperature range of the temperatures to which the materials were exposed during the temperature change. In other words, it is considered that the sealing material cured by heating is kept in a state wherein the material itself is firmly adhered to the CSP and the circuit board and the entire elements are shrunk together in the cooling process, whereas the sealing materials of Comparative Examples 3 and 4 become a glass state at the temperature under the glass transition point (Tg) resulting in occurrence of "strain" which is due to phenomenon that the CSP, the circuit board and the sealing material of glass state intend to shrink at the peculiar linear expansion coefficients. It is considered that the CSP (the electronic components and/or the semiconductor devices) which is most weak in strength is unable to bear the "strain", resulting in breakage.

The durable sealing property test which is conducted by repeating heat cycles further causes the repetition of strain, resulting in enlargement of the effect of the strain. It is considered that this enlarged effect invites the breakage of the CSP in the mounted structures of Examples 11-13 and Comparative Examples 3-4 in the heat cycle test. Accordingly, since the sealing material of each example according to the present invention exists in a rubber state over a wide temperature range, in other words, it has a lower glass transition point (Tg), the material shows the apparently contradict effect such that the on-spec product can retain the durable sealing of the electronic components and/or the semiconductor devices after the sealing is completed, while the off-specification product can be repaired with relative ease, in the case where the sealing material is used in the assembly process of the electric products wherein the off-specification product is subjected to repair.

The invention claimed is:

1. A sealing material comprising at least (a) a heat curable resin component and (b) a hardner for the heat curable resin component, which has:
   a $\Delta E/\Delta T$ in a range of from 0.5 MPa/° C. to 6.7 MPa/° C. wherein $\Delta E/\Delta T$ represents a ratio of change ($\Delta E$) in storage elastic modulus (E) relative to a temperature change ($\Delta T$) when the storage elastic modulus (E) is determined as the temperature is raised within a temperature range including a glass transition point (Tg) of the cured sealing material,
   wherein the glass transition point (Tg) of the sealing material is in a range from −80° C. to 50° C. after being cured.

2. The sealing material according to claim 1, which further comprises (c) an insulating filler component and/or (d) a reactive diluent component.

3. The sealing material according to claim 1, which has an elastic modulus of 100 MPa or higher at a temperature T1 which is lower than the glass transition point (Tg) and the elastic modulus of 10 MPa or lower at a temperature T2 which is higher than the glass transition point (Tg).

4. The sealing material according to claim 3, which has an elastic modulus of 1 GPa or higher at a temperature T1 which is lower than the glass transition point (Tg), and the elastic modulus of 10 MPa or lower at a temperature T2 which is higher than the glass transition point (Tg).

5. The sealing material according to claim 4, wherein the temperature at which the elastic modulus shows the ratio of change ($\Delta E/\Delta T$) within a range of from 0.5 MPa/° C. 6.7 MPa/° C. is in a range of from 50° C. to 200° C.

6. The sealing material according to claim 3, wherein the temperature at which the elastic modulus shows the ratio of change ($\Delta E/\Delta T$) within a range of from 0.5 MPa/° C. 6.7 MPa/° C. is in a range of from 50° C. to 200° C.

7. A method for mounting an electronic part on a board, comprising:
   (i) placing the electronic part at a predetermined position on a circuit board and forming an electrically conductive connection;
   (ii) supplying the electrically conductive connection and the area around the connection with the sealing material according to claim 1; and
   (iii) heating the board.

8. A repairing method which comprises optionally heating a mounting-completed board which is given by the method according to claim 7 up to a predetermined temperature and pressing a tool to an area around a boarder between the board and the sealing material to cause substantial interface failure between the board and the sealing material, and removing the sealing material and/or the electronic part from the board.

9. A mounted structure wherein an electronic part is placed at a predetermined position on a circuit board and an electrically conductive connection is formed between an electrode of the circuit board and a corresponding electrode of the electronic part, and the area around the connection and the area between the electronic part and the circuit board are sealed with the sealing material according to claim 1.

* * * * *